US 6,738,030 B2

United States Patent
Kim et al.

(10) Patent No.: US 6,738,030 B2
(45) Date of Patent: May 18, 2004

(54) DISPLAY DEVICE USING COF

(75) Inventors: Hak Su Kim, Seoul (KR); Jung Bae Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 404 days.

(21) Appl. No.: 09/969,613

(22) Filed: Oct. 4, 2001

(65) Prior Publication Data

US 2002/0041146 A1 Apr. 11, 2002

(30) Foreign Application Priority Data

Oct. 6, 2000 (KR) ........................................ 2000-58786

(51) Int. Cl.[7] .............................. G09G 3/12; G09G 3/36
(52) U.S. Cl. .......................................... 345/45; 345/87
(58) Field of Search ............................. 345/36, 37, 38, 345/39, 45, 46, 50, 54, 75.2, 76, 82, 87, 96

(56) References Cited

U.S. PATENT DOCUMENTS 6,552,712 B1 * 4/2003 Koizumi ..................... 345/104
6,611,261 B1 * 8/2003 Zhang et al. ................ 345/204

* cited by examiner

Primary Examiner—Vijay Shankar
(74) Attorney, Agent, or Firm—Fleshner & Kim, LLP

(57) ABSTRACT

Disclosed is a display device using a COF operating with a low driving voltage. The present invention includes a display panel, a COF having a connection part on which the display channel is placed and a chip part on which a chip is placed, data lines connected to the COF in a direction toward the chip, the data lines forming curves starting from the display panel, scan lines straightly connected to the COF, the scan lines starting from the panel in the direction toward the chip, scan line connection lines on the connection part, the scan line connection lines connecting the scan lines electrically to the COF, and data line connection lines on the connection part, the data line connection lines connecting the data lines electrically to the COF.

12 Claims, 5 Drawing Sheets

DISPLAY DEVICE USING COF

BACKGROUND OF THE INVENTION

1. Field of the Invention

The present invention relates to a display device using a chip on film (COF) operating with a low driving voltage.

2. Background of the Related Art

Lately, display devices having wide image areas are the trend of the times. The display devices have much more data and scan lines in order to improve image quality.

However, if the number of the scan lines is increased to improve the image quality of the display device having a simple matrix structure, there are many limitations on driving the display device.

FIG. 1 illustrates a diagram of a display device using a COF according to a related art.

Referring to FIG. 1, data lines are connected straight to a chip on film (hereinafter abbreviated COF) from a display panel. And, scan lines, which are arranged on left and right sides of the display panel respectively, extend from the display panel with forming a curve so as to be coupled with the COF.

As mentioned in the above explanation, the scan lines forming curves from both sides of the display panel extend longer than the data lines. Such a structure results in increasing line resistance of the scan lines and further delays a signal response.

In display devices such as EL (electro-luminescence), LED (light emitting diode), FED (field emission display) and the like, the line resistance of the scan lines has a close relation to the driving voltage of the display devices.

Namely, if the line resistance of the scan lines increases, the driving voltage thereof increases as well. Thus, the line resistance of the display device having a low driving voltage is a major issue.

SUMMARY OF THE INVENTION

Accordingly, the present invention is directed to a display device using a COF that substantially obviates one or more problems due to limitations and disadvantages of the related art.

An object of the present invention is to provide a display device using a COF enabling to reduce line resistance of scan and data lines in a display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device using a COF according to the present invention includes a display panel, a COF having a connection part on which the display channel is placed and a chip part on which a chip is placed, data and scan lines extending from the display panel, scan line connection lines on the connection part, the scan line connection lines connecting the scan lines electrically to the COF, and data line connection lines on the connection part, the data line connection lines connecting the data lines electrically to the COF, wherein the scan lines are directly connected to the chip on a first line in parallel with an extending line from the COF through the scan line connection lines formed on the COF at both sides of the display panel.

Preferably, the scan line connection lines are straightly connected to the scan lines at both sides of the display panel corresponding to the first line and the data line connection lines are connected to the data lines extending from both sides of the display panel corresponding to the second line. Also, a substrate material of the COF is one of glass and plastic.

In another aspect of the present invention, a display device using a COF includes a display panel, the COF having a connection part on which the display channel is placed and a chip part on which a chip is placed, data and scan lines extending from the display panel, scan line connection lines on the connection part, the scan line connection lines connecting the scan lines electrically to the COF, and data line connection lines on the connection part, the data line connection lines connecting the data lines electrically to the COF, wherein the scan lines are straightly connected to the COF through the scan line connection lines at both sides of the display panel on a first line in parallel with a direction extending from the COF, a portion of the data lines extends toward the chip from both sides of the display panel corresponding to a second line in a direction different from the extending direction of the COF, and the other portion of the data lines extends toward the chip from both sides of the display panel corresponding to a second line in a direction different from the extending line of the COF and is connected to the COF through the data line connection lines.

In a further aspect of the present invention, a display device using a COF includes a display panel, a COF having a connection part on which the display channel is placed and a chip part on which a chip is placed, data and scan lines extending from the display panel, scan line connection lines on the connection part, the scan line connection lines connecting the scan lines electrically to the COF, and data line connection lines on the connection part, the data line connection lines connecting the data lines electrically to the COF, wherein the scan lines are straightly connected to the COF toward the chip through the scan line connection lines at both sides of the display panel on a first line in parallel with an extending direction of the COF, and the data lines are connected to the COF through the data line connection lines from both sides of the display panel on a second line in a direction different from the extending direction of the COF.

Preferably, the scan line connection lines extend straightly on the first line and the data line connection lines form a curve with a predetermined angle so as to extend from the first line to the second line. The predetermined angle is 90°.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
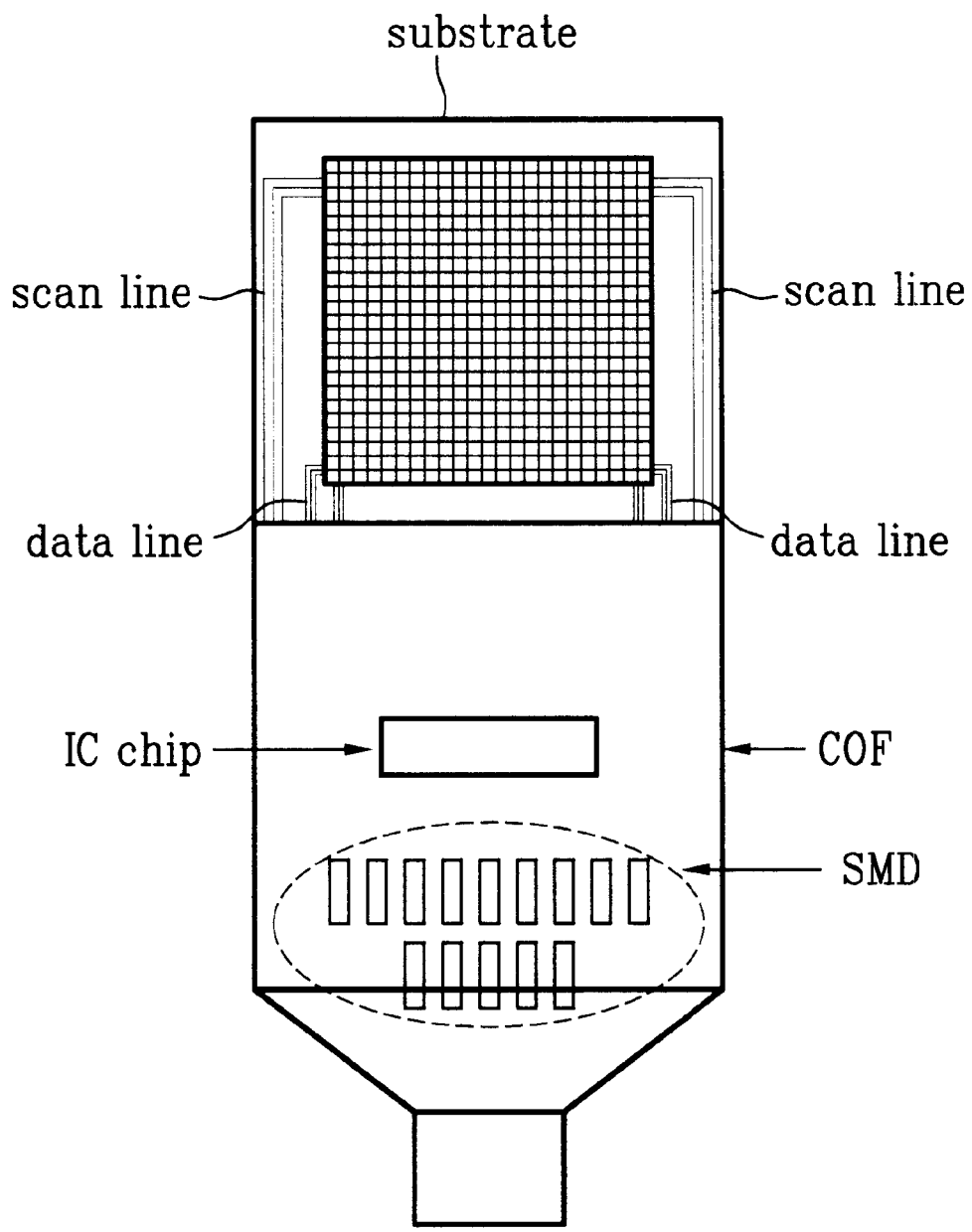
FIG. 1 illustrates a diagram of a display device using a COF according to a related art.
Figure 2:
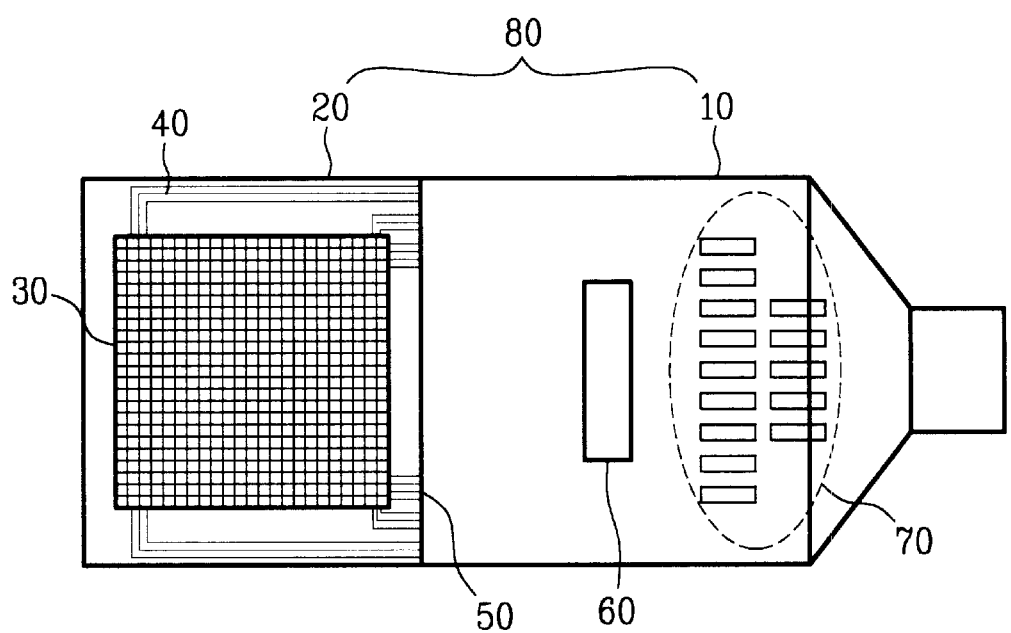
FIG. 2 illustrates a diagram of a display device using a COF according to a first embodiment of the present invention.

FIG. 2 illustrates a diagram of a display device using a COF according to a first embodiment of the present invention.

Referring to FIG. 2, a display device includes a display panel 30, a COF 80 having a connection part 20 on which the display panel 30 is placed and a chip part 10 on which a driving chip 60 is placed, and data and scan lines 40 and 50 extending from the display panel 30 respectively. Besides, a reference numeral '70' indicates SMD parts.

The scan lines 50 are connected straight to the COF 80 from the display panel 30 toward the IC (integrated circuits) chip 60 for driving (hereinafter abbreviated chip) a display device. Forming curves from the display panel 30 toward the chip 60, the data lines 40 are connected to the COF 80. And, a substrate material of the COF 80 is glass or plastic.

The scan and data lines 50 and 40 extend from the display panel 30 attached to the glass or plastic as the substrate material of the COF 80. The scan and data lines 40 are electrically connected to the driving chip 60 and the SMD parts 70, respectively. Thus, the driving chip 60 drives the display panel 30.

Meanwhile, the length of the scan lines between the display panel 30 and COF 80 is short as the scan lines 50 are straightly connected to the COF 80. On the other hand, the other length between the data lines 40 and COF 80 is relatively long.

Generally, an IC chip for driving a current driving type display device uses a constant-current power supply, whereby a resistance value of data lines has less influence on a driving voltage of the display device.

Therefore, in the first embodiment of the present invention, the scan lines 50 of the display panel 30 which are connected to a connection line (not shown in the drawing) are shorter than the data lines 40 connected to the other connection line (not shown in the drawing) of the COF 80 so as to be connected to the COF 80. Thus, the line resistance of the scan lines 50 in the display device is reduced.

Besides, the IC chip 60 includes a constant-current power supply supplying the display device with a constant current.

And, the display device includes EL (electro-luminescence), LED (light emitting diode), FED (field emission display) and the like.

In this case, a width of the COF 80 is equal to or shorter than that of the display panel 30.

Figure 3A:
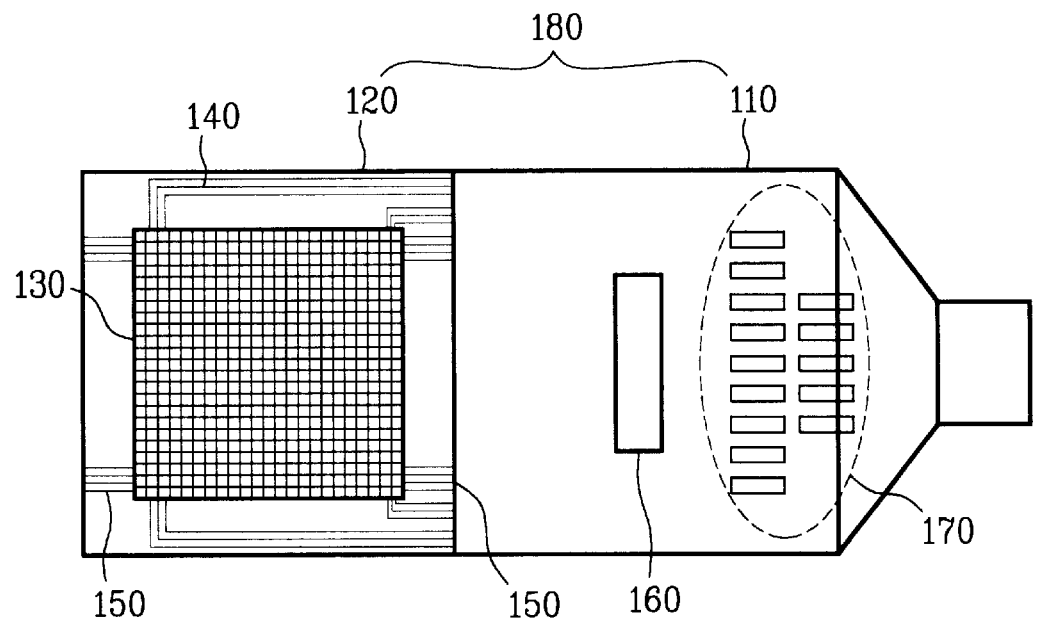
FIG. 3A illustrates a diagram of a display device using a COF according to a second embodiment of the present invention.
Figure 3B:
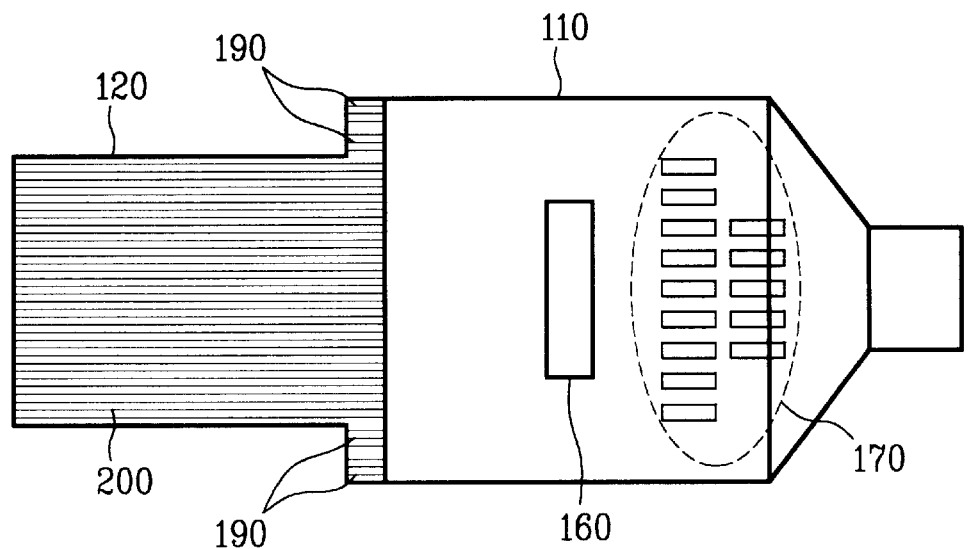
FIG. 3B illustrates a diagram of a COF structure according to a second embodiment of the present invention.

FIG. 3A illustrates a diagram of a COF type display device according to a second embodiment of the present invention, and FIG. 3B illustrates a diagram of a COF structure according to a second embodiment of the present invention.

Referring to FIG. 3A, a display device according to a second embodiment of the present invention includes a display panel 130, a COF 180 having a connection part 120 on which the display panel 130 is placed and a chip part 110 on which a chip 160 is placed, and data and scan lines 140 and 150 extending from the display panel 130 respectively.

The connection part 120 includes data line connection lines 190 and scan line connection lines 200. The scan line connection lines 200 are formed on the connection part 120 and connect the scan lines 150 electrically to the COF 180. The data line connection lines 190 are formed on the connection part 120 and connect the data lines 140 electrically to the COF 180.

The scan lines 150 are straightly connected to the COF 180 through the scan line connection lines 200 at both sides of the display panel 130 on the first line in parallel with an extension line of the COF 180.

Forming curves from both sides of the display panel 130 corresponding to a second line perpendicular to an extending direction of the COF 180, the data lines 140 extend toward the chip 160 so as to be connected to the COF 180 through the data line connection lines 190.

In this case, the scan line connection lines 200 are straightly connected to the scan lines 150 at both sides of the display panel 130 corresponding to the first line, while the data line connection lines 190 are connected to the data lines 140 extending from both sides of the display panel 130 corresponding to the second line. Thus, the scan line connection lines 200 are longer than the data line connection lines 190.

A resistance value of the scan lines depends on a metal inside the display device. If the resistance value is high, it is able to reduce a half of the resistance value of the scan lines 150 using the COF 180 shown in FIG. 3B.

The COF 180 shown in FIG. 3B includes the chip part 110 having the IC chip 160 and the SMD parts 170 and the connection part 120 to which the display panel 130 will be attached.

On the connection part 120, the scan line connection lines 200, which will be connected to the scan lines 150 of the display device, are formed as long as a length of the connection part 120 in a direction of connecting the connection part 120 to the chip part 110.

Meanwhile, the data line connection lines 190, which will be connected to the data lines 140 of the display device, are formed so as to be much shorter than the scan line connection lines 200.

As shown in FIG. 3A and FIG. 3B, the connection part 120 of the COF 180 is simultaneously connected to both sides of the display panel 130 on the first line.

Namely, a portion of the scan lines 150 starting from the display panel 130 is connected to one end of the connection part 120 far from the chip part 110, while the other portion of the scan lines 150 starting from the display panel 130 is connected to the other end of the connection part 120 adjacent to the chip part 110.

As mentioned in the forgoing explanation, the scan lines 150 of the display device are connected to the COF 180 at both sides of the display panel 130, thereby enabling to reduce the resistance value of the scan lines 150.

Moreover, the display device according to the second embodiment of the present invention uses the scan driving IC chip 160, as shown in FIG. 3A, whereby both sides of the display panel 130 corresponding to the first line are able to be simultaneously connected to the chip 160. Therefore, the display panel 130 is driven faster.

Figure 4A:
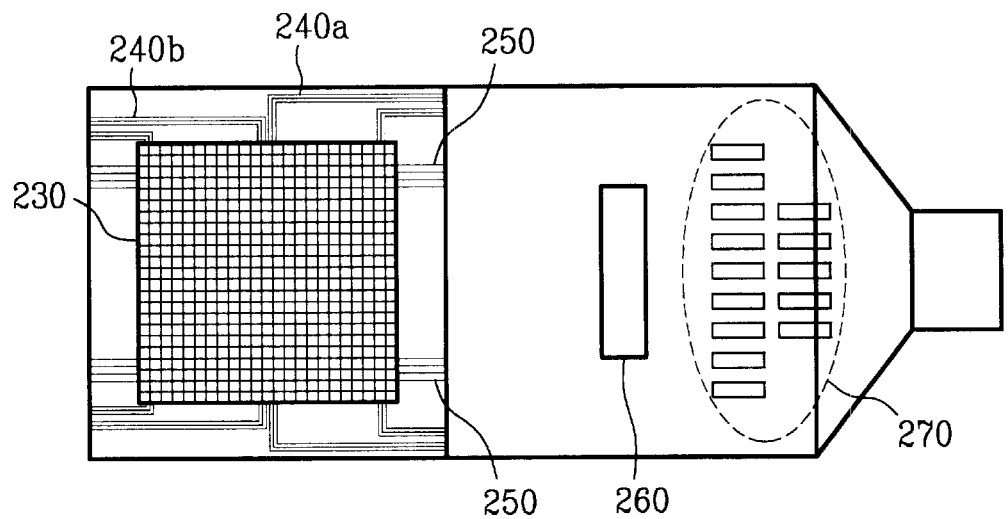
FIG. 4A illustrates a diagram of a display device using a COF according to a third embodiment of the present invention.
Figure 4B:
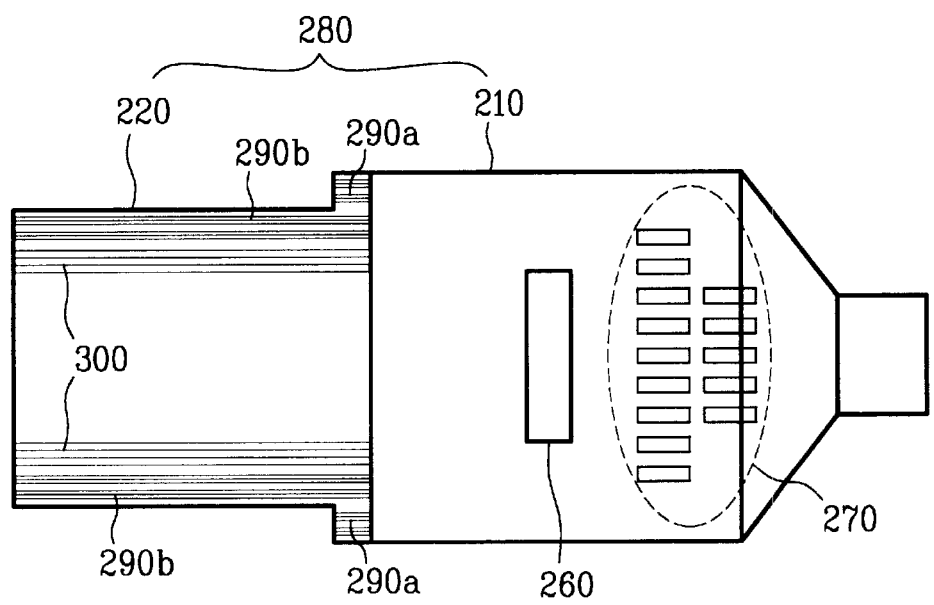
FIG. 4B illustrates a diagram of a COF structure according to a third embodiment of the present invention.

FIG. 4A illustrates a diagram of a display device using a COF according to a third embodiment of the present invention, and FIG. 4B illustrates a diagram of a COF structure according to a third embodiment of the present invention.

Referring to FIG. 4A, a display device according to a third embodiment of the present invention includes a display panel 230, a COF 280 having a connection part 220 on which the display panel 230 is placed and a chip part 210 on which a chip 260 is placed, and data and scan lines 240 and 250 extending from the display panel 230 respectively.

As shown in FIG. 4B, the connection part 220 includes data line connection lines 290 and scan line connection lines 300. The scan line connection lines 300 are formed on the connection part 220 and connect the scan lines 250 electrically to the COF 280. The data line connection lines 290 are formed on the connection part 220 and connect the data lines 240 electrically to the COF 280.

In FIG. 4A, the scan lines 250 are straightly connected to the COF 280 through the scan line connection lines 300 at both sides of the display panel 230 on a first line in parallel with a direction extending from the COF 280. And, forming curves from both sides of the display panel 230 corresponding to a second line perpendicular to the extending direction of the COF 280, a portion 240a of the data lines 240 extends toward the chip 260 so as to be connected to the COF 280 through the data line connection lines 290.

Besides, forming curves from both sides of the display panel 230 corresponding to a second line perpendicular to the extending line of the COF 280, the other portion 240b of the data lines 240 extend in a direction opposite to the chip 260 so as to be connected to the COF 280 through the data line connection lines 290.

As mentioned in the above description, the COF 280 is constructed with the connection part 220 on which the display panel 230 is placed and the chip part 210 on which the chip 260 is placed. And, the connection part 220 includes the scan line connection lines 300 extending on the first line and the data line connection lines 290 also extending on the first line.

In this case, the scan line connection lines 300 are straightly connected to the scan lines 250 at both sides of the display panel 230 corresponding to the first line, while the data line connection lines 290 are connected to the data lines 240 extending from both sides of the display panel 230 corresponding to the second line. Thus, the scan line connection lines 300 are longer than the data line connection lines 290.

The data lines 240a and 240b starting from the display panel 230, as shown in FIG. 4A, are formed on a substrate (glass or plastic) so as to be separated into two parts in opposite directions each other. Therefore, a maximum resistance value of the data lines 240 is reduced to one half of the original resistance value.

The scan line connection lines 300 and data line connection lines 290b, which will be connected to the scan lines 250 starting from the display panel 230 and to the data lines 240b respectively, as shown in FIG. 4B, are formed to the extent of the length of the connection part 220. Yet, the data line connection lines 290a, which will be connected to the data lines 240a, are formed much shorter than the connection part 220.

Namely, the connection part 220, as is the same case of the second embodiment of the present invention, is connected to both sides of the display panel 230 on the first line simultaneously. The scan line connection lines 300 are formed on the substrate so that the scan lines 250 are connected to the connection part 220. And, the data line connection lines 290a and 290b are formed so as to connect the data lines 240a and 240b separated to extend from both sides of the display panel 230 to the COF 280 on the second line.

As mentioned in the forgoing explanation, the data lines 240a and 240b split to start from both sides of the display panel 230 as well, thereby enabling to reduce half of the resistance value of the data lines 240 as well as half of the resistance value of the scan lines 250.

Figure 5A:
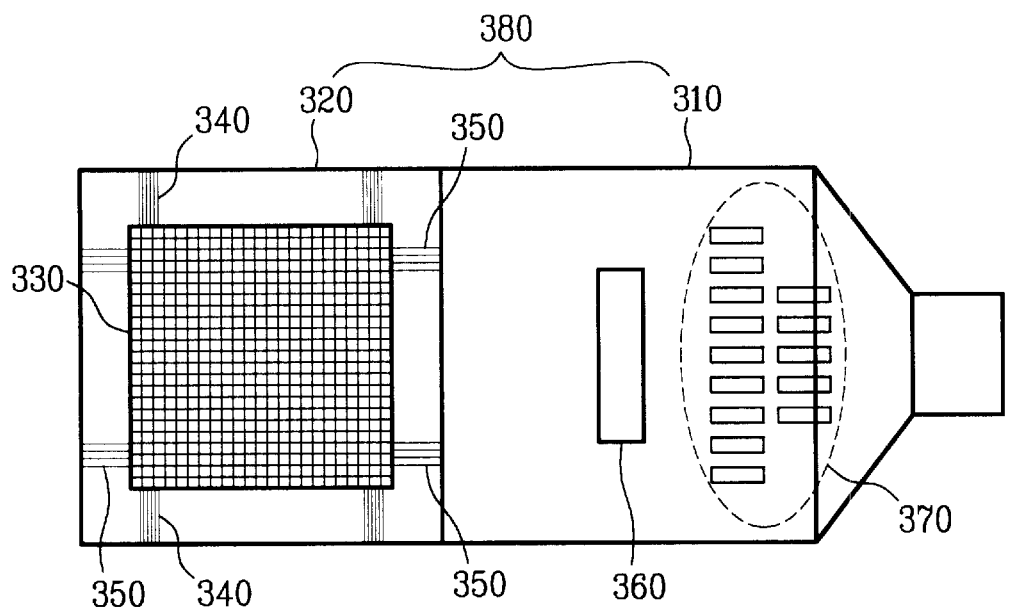
FIG. 5A illustrates a diagram of a display device using a COF according to a fourth embodiment of the present invention.
Figure 5B:
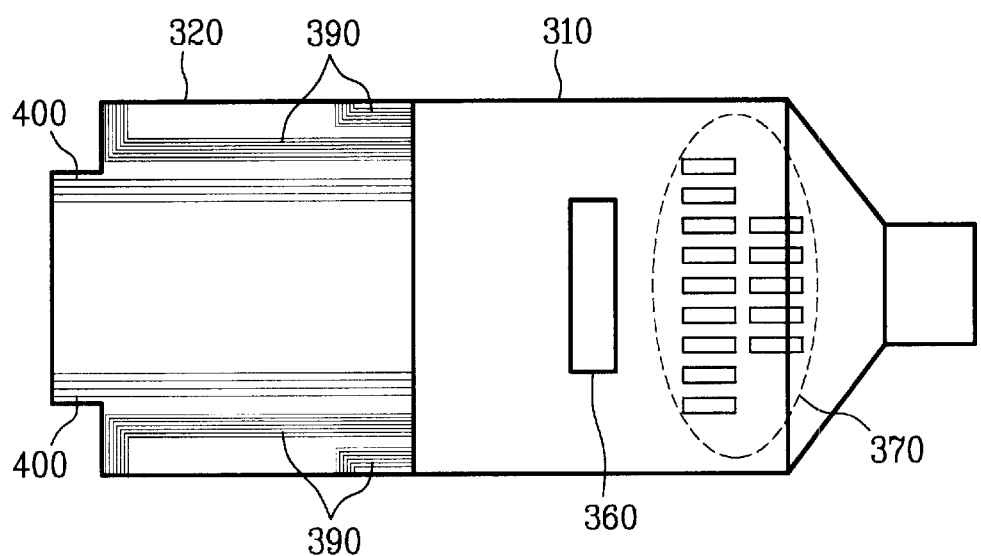
FIG. 5B illustrates a diagram of a COF structure according to a fourth embodiment of the present invention.

FIG. 5A illustrates a diagram of a display device using a COF according to a fourth embodiment of the present invention, and FIG. 5B illustrates a diagram of a COF structure according to a fourth embodiment of the present invention.

Referring to FIG. 5A, a display device according to a fourth embodiment of the present invention includes a display panel 330, a COF 380 having a connection part 320 on which the display panel 330 is placed and a chip part 310 on which a chip 360 is placed, and data and scan lines 340 and 350 extending from the display panel 330 respectively.

As shown in FIG. 5B, the connection part 320 includes data line connection lines 390 and scan line connection lines 400. The scan line connection lines 400 are formed on the connection part 320 and connect the scan lines 350 electrically to the COF 380. The data line connection lines 390 are formed on the connection part 320 and connect the data lines 340 electrically to the COF 380.

In FIG. 5A, the scan lines 350 are straightly connected to the COF 380 toward the chip 360 through the scan line connection lines 400 at both sides of the display panel 330 on a first line in parallel with a direction extending from the COF 380.

And, the data lines 340 are connected to the COF 380 through the data line connection lines 390 from both sides of the display panel 330 on a second line perpendicular to the extending direction of the COF 380.

As mentioned in the above description, the COF 380 is constructed with the connection part 320 on which the display panel 330 is placed and the chip part 310 on which the chip 360 is placed.

On the connection part 320 formed are the scan line connection lines 400 extending straightly on the first line and the data line connection lines 390 forming a curve with a predetermined angle so as to extend from the first line to the second line. The predetermined angle in FIG. 5B is 90°.

In detail, as shown in FIG. 5A and FIG. 5B, the scan line connection lines 400 are formed so that the scan lines 350 are connected directly to the COF 380 on the first line. And, the data line connection lines 390 are formed so that the data lines 340 are directly connected to the COF 380 on the second line. Thus, the data lines 340 are arranged in a direction forming a right angle with the scan lines 350.

The data lines 340 are arranged as a straight-line form like the scan lines 350. And, the COF 380 shown in FIG. 5B is used. Therefore, the resistance value of the data lines 340 as well as that of the scan lines 350 is reduced.

As shown in FIG. 5B, the COF 380 includes the chip part 310 having the IC chip 360 and an SMD part 370 and the connection part 320 having the scan and data line connection lines 400 and 390 which connect the scan and data lines 350 and 340 starting from the display panel 330 to the COF 380 respectively.

Besides, the scan line connection lines 400, as shown in FIG. 5B, having the longest length of the connection part 320 in order to connect the scan lines 350 to the COF 380 are formed on the connection part 320 in a direction of the first line.

And, the data line connection lines 390, which will be connected to the data lines 340, are arranged in a direction so as to be bent with a predetermined angle from the first line to the second line. The bending angle in FIG. 5B is 90°.

Accordingly, the structures of the display device according to the embodiments of the present invention enable to reduce the resistance of the scan and data lines starting from the display panel and further decrease the driving voltage of the display device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A display device using a COF comprising:

a display panel;

a COF having a connection part on which the display channel is placed and a chip part on which a chip is placed;

data and scan lines extending from the display panel;

scan line connection lines on the connection part, the scan line connection lines connecting the scan lines electrically to the COF; and data line connection lines on the connection part, the data line connection lines connecting the data lines electrically to the COF, wherein the scan lines are directly connected to the chip on a first line in parallel with an extending line from the COF through the scan line connection lines formed on the COF at both sides of the display panel.

2. The display device of claim 1, wherein the chip is a scan driver chip driving the display panel by connecting both of the sides of the display panel simultaneously.

3. The display device of claim 1, wherein the scan line connection lines are straightly connected to the scan lines at both sides of the display panel corresponding to the first line and the data line connection lines are connected to the data lines extending from both sides of the display panel corresponding to the second line.

4. The display device of claim 1, wherein a substrate material of the COF is one of glass and plastic.

5. The display device of claim 1, wherein the display device includes EL (electro-luminescence), LED (light emitting diode), FED (field emission display).

6. A display device using a COF comprising:

a display panel;

the COF having a connection part on which the display channel is placed and a chip part on which a chip is placed;

data and scan lines extending from the display panel;

scan line connection lines on the connection part, the scan line connection lines connecting the scan lines electrically to the COF; and data line connection lines on the connection part, the data line connection lines connecting the data lines electrically to the COF, wherein the scan lines are straightly connected to the COF through the scan line connection lines at both sides of the display panel on a first line in parallel with a direction extending from the COF, a portion of the data lines extends toward the chip from both sides of the display panel corresponding to a second line in a direction different from the extending direction of the COF, and the other portion of the data lines extends toward the chip from both sides of the display panel corresponding to a second line in a direction different from the extending line of the COF and is connected to the COF through the data line connection lines.

7. The display device of claim 6, wherein the chip is a scan driver chip driving the display panel by connecting both of the sides of the display panel simultaneously.

8. The display device of claim 6, wherein a substrate material of the COF is one of glass and plastic.

9. A display device using a COF comprising:

a display panel;

a COF having a connection part on which the display channel is placed and a chip part on which a chip is placed;

data and scan lines extending from the display panel;

scan line connection lines on the connection part, the scan line connection lines connecting the scan lines electrically to the COF; and data line connection lines on the connection part, the data line connection lines connecting the data lines electrically to the COF, wherein the scan lines are straightly connected to the COF toward the chip through the scan line connection lines at both sides of the display panel on a first line in parallel with an extending direction of the COF, and the data lines are connected to the COF through the data line connection lines from both sides of the display panel on a second line in a direction different from the extending direction of the COF.

10. The display device of claim 9, wherein the chip is a scan driver chip driving the display panel by connecting both of the sides of the display panel simultaneously.

11. The display device of claim 9, wherein the scan line connection lines extend straightly on the first line and the data line connection lines form a curve with a predetermined angle so as to extend from the first line to the second line.

12. The display device of claim 9, wherein the predetermined angle is 90°.

* * * * *